United States Patent
You et al.

(10) Patent No.: US 11,696,482 B2
(45) Date of Patent: *Jul. 4, 2023

(54) DISPLAY DEVICE

(71) Applicant: Samsung Display Co., LTD., Yongin-si (KR)

(72) Inventors: Chun Gi You, Yongin-si (KR); Tae Ik Kim, Yongin-si (KR); Hyun Sik Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/723,403

(22) Filed: Apr. 18, 2022

(65) Prior Publication Data

US 2022/0246686 A1    Aug. 4, 2022

Related U.S. Application Data

(63) Continuation of application No. 17/083,248, filed on Oct. 28, 2020, now Pat. No. 11,309,367.

(30) Foreign Application Priority Data

Mar. 20, 2020 (KR) .................. 10-2020-0034366

(51) Int. Cl.
*G09G 5/00* (2006.01)
*H10K 59/40* (2023.01)
(Continued)

(52) U.S. Cl.
CPC ............. *H10K 59/40* (2023.02); *G06F 3/041* (2013.01); *H10K 50/844* (2023.02);
(Continued)

(58) Field of Classification Search
CPC ............... H01L 27/323; H01L 51/5253; H01L 27/3246; H01L 27/3258; H01L 51/0096;
(Continued)

(56) References Cited

U.S. PATENT DOCUMENTS 10,163,990 B2    12/2018  Chung et al.
10,318,031 B2    6/2019   Choi et al.
(Continued)

FOREIGN PATENT DOCUMENTS

KR    10-2017-0113734    10/2017
KR    10-2017-0113887    10/2017
(Continued)

OTHER PUBLICATIONS

Non-Final Office Action dated Aug. 13, 2021, in U.S. Appl. No. 17/083,248.
(Continued)

*Primary Examiner* — Jennifer T Nguyen
(74) *Attorney, Agent, or Firm* — H.C. Park & Associates, PLC

(57) ABSTRACT

A display device includes: a display panel including a base substrate having a display region and a hole region included in the display region; a touch sensor including a light blocking member disposed on the display panel, a first sensing insulating layer covering the light blocking member, a sensing electrode layer disposed on the first sensing insulating layer, and a second sensing insulating layer covering the sensing electrode layer; a polarizing layer disposed on the touch sensor; and a cover window disposed on the polarizing layer. At least one of the first sensing insulating layer and the second sensing insulating layer exposes at least a portion of the hole region.

23 Claims, 11 Drawing Sheets

(51) Int. Cl.
*G06F 3/041* (2006.01)
*H10K 50/844* (2023.01)
*H10K 59/122* (2023.01)
*H10K 59/124* (2023.01)
*H10K 77/10* (2023.01)

(52) U.S. Cl.
CPC ......... *H10K 59/122* (2023.02); *H10K 59/124* (2023.02); *H10K 77/10* (2023.02)

(58) Field of Classification Search
CPC ........ G06F 3/041; H10K 59/40; H10K 77/10; H10K 59/122; H10K 59/124; H10K 50/844
USPC .......................................................... 345/173
See application file for complete search history.

(56) References Cited

U.S. PATENT DOCUMENTS

| | | | |
|---|---|---|---|
| 10,449,901 B2 | 10/2019 | Park et al. | |
| 10,541,380 B1* | 1/2020 | Sung | H01L 51/0097 |
| 10,564,756 B2 | 2/2020 | Lee et al. | |
| 11,309,367 B2* | 4/2022 | You | G06F 3/04164 |
| 2016/0285043 A1* | 9/2016 | Lee | H01L 51/5253 |
| 2019/0393444 A1* | 12/2019 | Nam | H01L 27/326 |
| 2020/0064968 A1* | 2/2020 | Kim | G06F 3/0445 |
| 2020/0168683 A1 | 5/2020 | Son et al. | |
| 2020/0194714 A1* | 6/2020 | Won | H01L 27/3248 |
| 2020/0328375 A1 | 10/2020 | Won | |
| 2021/0193751 A1* | 6/2021 | Jang | H01L 27/3258 |

FOREIGN PATENT DOCUMENTS

| | | |
|---|---|---|
| KR | 10-2017-0141311 | 12/2017 |
| KR | 10-2019-0073716 | 6/2019 |

OTHER PUBLICATIONS

Notice of Allowance dated Dec. 16, 2021, in U.S. Appl. No. 17/083,248.

Notice of Allowance dated Dec. 29, 2021, in U.S. Appl. No. 17/083,248.

* cited by examiner

DISPLAY DEVICE

CROSS-REFERENCE TO RELATED APPLICATION

This application is a Continuation of U.S. patent application Ser. No. 17/083,248, filed on Oct. 28, 2020, which claims priority from and the benefit of Korean Patent Application No 10-2020-0034366 filed on Mar. 20, 2020 which are hereby incorporated by reference for all purposes as if fully set forth herein

BACKGROUND

Field

Exemplary implementations of the invention relate generally to a display device, and more specifically, to a display device with a display region having a hole to accommodate a camera, a sensor, etc.

Discussion of the Background

With the development of information technologies, the importance of a display device as a connection medium between a user and information has increased. Accordingly, display devices such as a liquid crystal display device, an organic light emitting display device, and a plasma display device have been increasingly used.

A display device may include a display panel and a touch sensor overlapping the display panel to receive a touch input or fingerprint information of a user. For example, the touch sensor may be attached to one surface of the display panel or be integrally formed with the display panel.

More recently, a display device may include a hole (or opening) in a display region (or active region) to receive a camera or sensor so as to minimize a non-display region including the bezel of the display device.

The above information disclosed in this Background section is only for understanding of the background of the inventive concepts, and, therefore, it may contain information that does not constitute prior art.

SUMMARY

Applicant discovered that when the space between an encapsulation layer and a light emitting element layer of a display panel is shallow, light incident on the camera, sensor or the like received through the hole region in the display area is scattered or reflected such that the image obtained by the camera or sensor is distorted.

Display devices constructed according to the principles and exemplary implementations of the invention are capable of reducing scattering and reflection of the light incident on the camera, sensor or the like received through the hole region of the display area. For example, a gap may be provided to increase the depth of the space between the encapsulation and the light emitting layer and/or at least one of insulating layers of a touch sensor disposed on the display panel does not overlap the hole region. Thus, the quality of images of the camera, sensor, etc., may be enhanced by reducing the scattering and the reflection of the light incident in the hole region to improve transmittance of light and/or prevent color distortion of the camera or sensor.

For example, display devices constructed according to the principles and some exemplary implementations of the invention form a deeper space between the encapsulation layer and the light emitting layer by removing a portion of an inorganic insulating layer of the touch sensor, thereby improving transmittance of light and/or preventing color distortion of the camera, sensor or the like in the hole region.

In addition, display devices constructed according to the principles and some exemplary implementations of the invention are capable of reducing scattering and reflection of the light incident on the camera through hole regions in the display area of the display devices by providing an encapsulation layer including a groove overlapping at least a portion of the hole regions to increase the depth of the gap between the encapsulation layer and the light emitting layer.

Additional features of the inventive concepts will be set forth in the description which follows, and in part will be apparent from the description, or may be learned by practice of the inventive concepts.

According to an aspect of the invention, a display device includes: a display panel including a base substrate having a display region and a hole region included in the display region; a touch sensor including a light blocking member disposed on the display panel, a first sensing insulating layer covering the light blocking member, a sensing electrode layer disposed on the first sensing insulating layer, and a second sensing insulating layer covering the sensing electrode layer; a polarizing layer disposed on the touch sensor; and a cover window disposed on the polarizing layer, wherein at least one of the first sensing insulating layer and the second sensing insulating layer exposes at least a portion of the hole region.

The hole region may include a first region through which light is transmitted and a second region which surrounds a periphery of the first region and blocks light.

At least one of the first sensing insulating layer and the second sensing insulating layer may not overlap the first region while overlapping the second region.

The display panel may further includes: a pixel circuit layer disposed on the base substrate; a light emitting element layer disposed on the pixel circuit layer; and an encapsulation layer disposed above the light emitting element layer while being vertically spaced apart from the light emitting element layer, to cover the light emitting element layer and define a space between the encapsulation layer and the light emitting element layer.

The encapsulation layer may substantially entirely overlap the hole region.

The encapsulation layer may have a lower surface including a groove overlapping at least a portion of the hole region.

The groove may substantially entirely overlap the first region.

At least one of the first sensing insulating layer and the second sensing insulating layer may overlap at least a portion of the groove.

The light blocking member may be directly disposed on the encapsulation layer to overlap the second region and not to overlap the first region.

The encapsulation layer may include transparent glass.

The sensing electrode layer may overlap the display region and does not overlap the hole region.

The pixel circuit layer and the light emitting element layer may overlap the display region and may not overlap the first region.

The pixel circuit layer may include a buffer layer, a semiconductor layer disposed on the buffer layer, a first insulating layer disposed over the semiconductor layer, a first conductive layer disposed on the first insulating layer, and a second insulating layer disposed over the first conductive layer, wherein at least one of the first insulating layer and the second insulating layer may overlap the second region.

The light emitting element layer may include a first pixel electrode, a pixel defining layer disposed over the first pixel electrode, a light emitting layer disposed on the first pixel electrode exposed by the pixel defining layer, and a second pixel electrode disposed on the light emitting layer, wherein the pixel defining layer and the light emitting layer may overlap the display region, and do not overlap the hole region.

The polarizing layer may overlap at least a portion of the second region and does not overlap the first region.

At least one of the first sensing insulating layer and the second sensing insulating layer may include at least one of silicon nitride, silicon oxynitride, silicon oxide, titanium oxide, and aluminum oxide.

According to another aspect of the invention, a display panel includes: a base substrate having a display region and a hole region included in the display region; a pixel circuit layer disposed on the base substrate; a light emitting element layer disposed on the pixel circuit layer; and an encapsulation layer spaced apart from the light emitting element layer at a predetermined distance, the encapsulation layer being disposed above the light emitting element layer to cover the light emitting element layer and define a space between the encapsulation layer and the light emitting element layer, wherein the encapsulation layer substantially entirely overlaps the hole region.

The hole region may include a first region through which light is transmitted and a second region which surrounds a periphery of the first region to block light, wherein the encapsulation layer may have a lower surface including a groove overlapping at least a portion of the hole region.

The groove may substantially entirely overlap the first region.

The pixel circuit layer and the light emitting element layer may overlap the display region and do not overlap the first region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
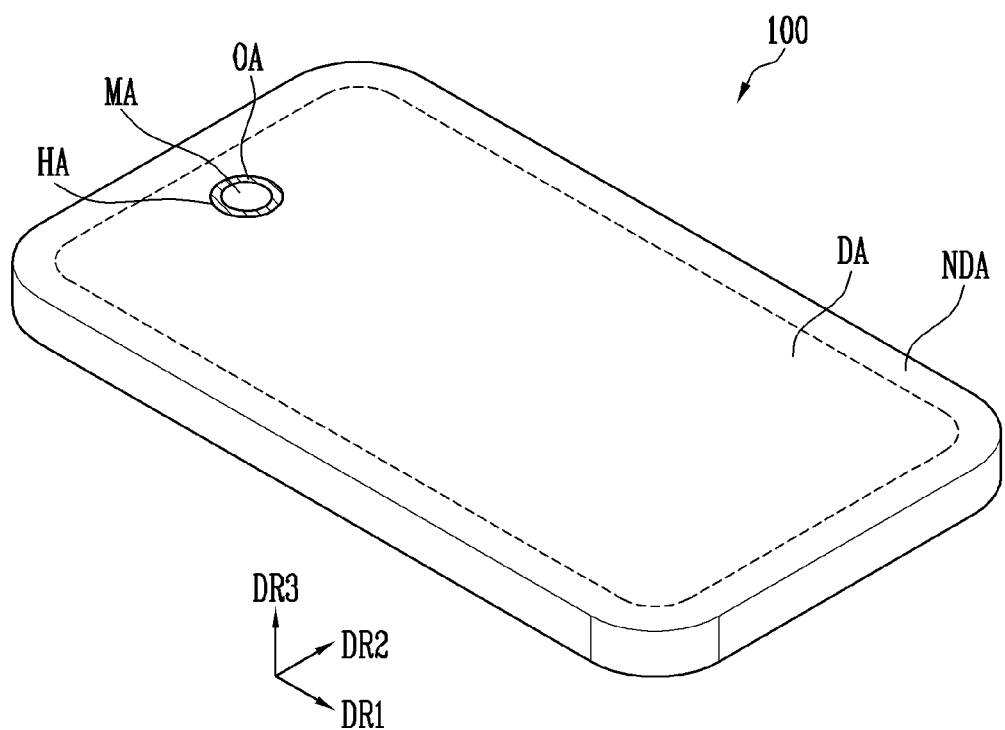
FIG. 1A is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
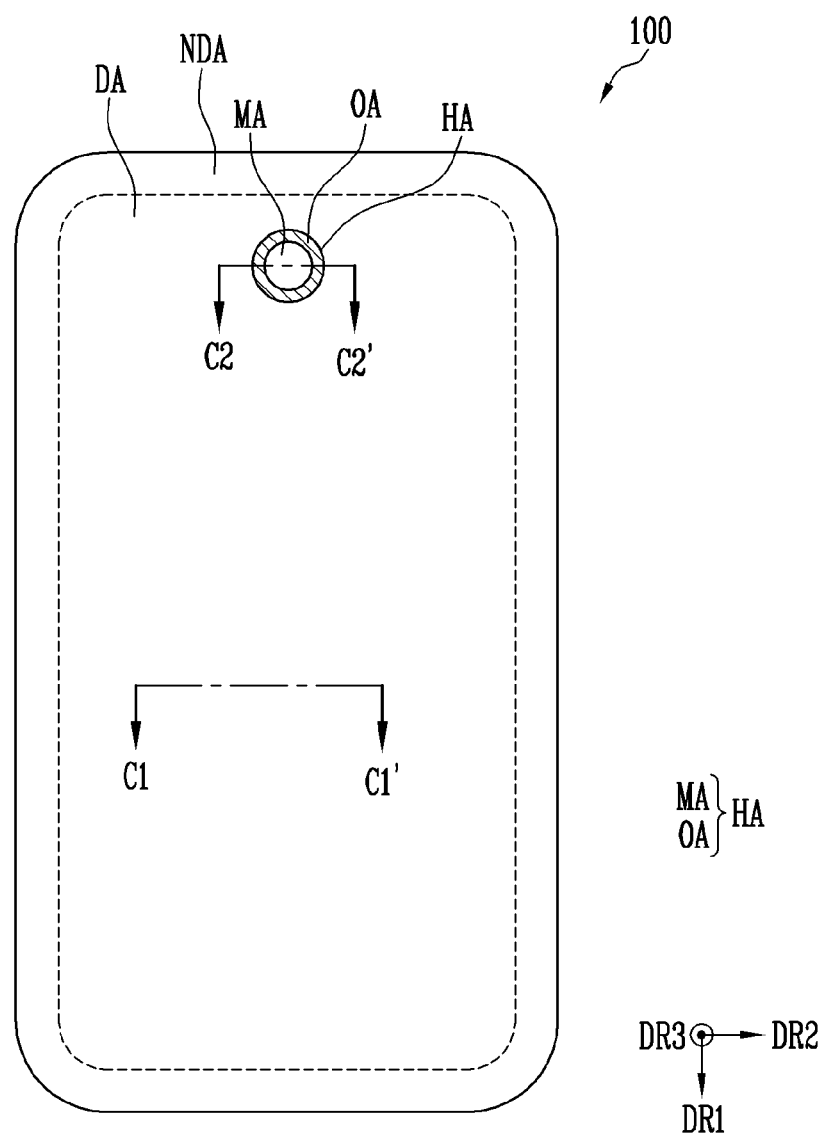
FIG. 1B is a plan view of the display device of FIG. 1A.

FIG. 1A is a perspective view of an exemplary embodiment of a display device constructed according to the principles of the invention. FIG. 1B is a plan view of the display device of FIG. 1A.

Referring to FIGS. 1A and 1B, the display device 100 may include a display region DA and a non-display region NDA.

The display region DA may be defined as a region in which an image is displayed. The display device 100 may include a plurality of pixels in the display region DA. The display region DA may be used as not only the region in which the image is displayed but also a region for recognizing a touch input or fingerprint of a user.

The display region DA may include a plane defined by a first direction DR1 and a second direction DR2. The second direction DR2 may form an angle of 90 degrees with respect to the first direction DR1, or form an angle of 90 degrees or less with respect to the first direction DR1. The display region DA may have a generally flat plate shape, but exemplary embodiments are not limited thereto. For example, at least a partial region in the display region DA, which is adjacent to the non-display region NDA, may be a curved surface extending in the opposite direction of a third direction DR3. The third direction DR3 is a direction perpendicular to the first direction DR1 and the second direction DR2, and may be a direction defining the thickness of the display device 100 or a direction in which the display region DA is exposed to display an image. The display region DA may have a generally quadrangular or rectangular shape, and have at least one round corner. However, exemplary embodiments are not limited thereto.

Hereinafter, the terms "overlap" or "overlapping" means that at least two components are disposed one over the, when the display device 100 is viewed in the third direction DR3 of the display device 100. In addition, the surface to which the display region DA is exposed in the third direction DR3 may be designated as the front surface of the display device 100, and the surface facing the front surface of the display device 100 in the opposite direction of the third direction DR3 may be designated as the rear surface of the display device 100. However, the first to third directions DR1 to DR3 shown in FIG. 1 are relative concepts, and may be changed into other directions.

The non-display region NDA may be a region in which the image is not displayed. The non-display region NDA may be a region at least partially surrounding the periphery of the display region DA. Various driving circuits, a power supply, and the like of the display device 100 may be disposed in a region overlapping the non-display region NDA.

The display device 100 may include at least one of a camera module and a sensor module or the like. The sensor module may include at least one of an infrared sensor, an illuminance sensor, and an acceleration sensor.

The display region DA may include a hole region HA overlapping at least one of the camera module and the sensor module. The hole region HA may be disposed in the middle of an upper end of the display region DA as shown in FIGS. 1A and 1B, but be disposed adjacent to one of corners of the display region DA. For example, the hole region HA may be disposed adjacent to a corner located at a right (or left) upper end of the display region DA.

The hole region HA may include a region through which incident light is transmitted (or received) such that an image is not displayed. Specifically, the hole region HA may include a first inner region MA through which light is transmitted and a second outer region OA which surrounds the periphery of the first region MA and blocks light. The second region OA may be a region which blocks light from being incident upon the light emitting element layer 30 to reduce or prevent mutual interference between light generated in a light emitting element layer 30 and light incident from the outside.

Thus, light reaches the camera module through the hole region HA (more particularly, through the first region MA), so that the display device 100 can photograph a subject. When the hole region HA is disposed in the display region DA as shown in FIGS. 1A and 1B, the display region NDA of the display device 100 is minimized. Accordingly, the bezel of the display device 100 can be reduced, and width of the display region DA can be increased.

Hereinafter, the display region DA, the non-display region NDA, and the hole region HA, which are described above, are defined on a base substrate 10 of the display panel DP included in the display device 100.

Figure 2:
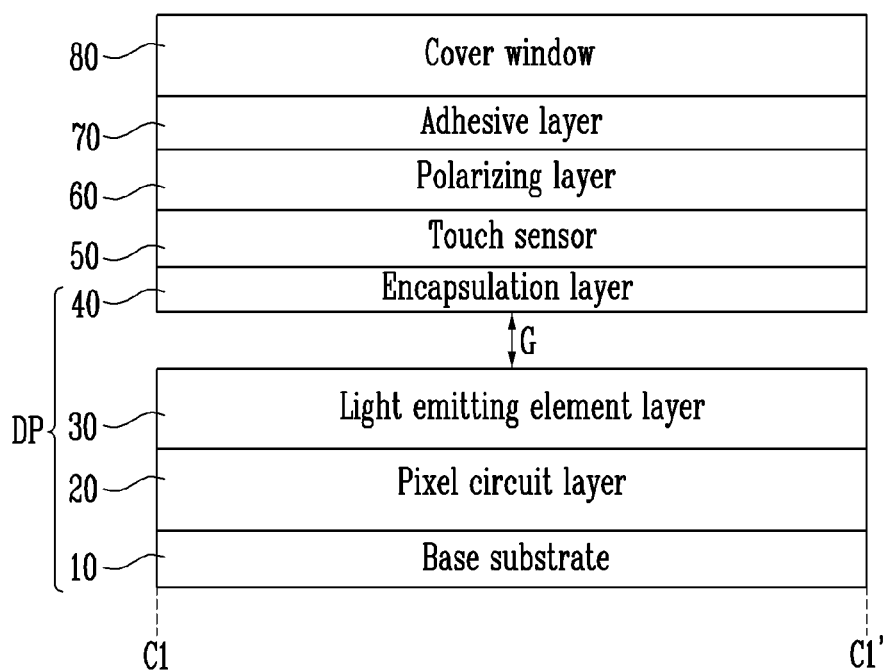
FIG. 2 is a sectional view taken along line C1-C1' of FIG. 1B.

FIG. 2 is a sectional view taken along line C1-C1' of FIG. 1B.

FIG. 2 illustrates the display device 100 so as to describe the stacked relationship of components constituting the display device 100 and their relative arrangement relationship. But, exemplary embodiments are not limited to the illustrated specifics, including the relative the thickness or area of each component.

Referring to FIG. 2, the display device 100 may include a display panel DP, a touch sensor 50, a polarizing layer 60, an adhesive layer 70, and/or a cover window 80.

The display panel DP may include a base substrate 10, on which the display region DA and the hole region HA included in the display region DA are defined, a pixel circuit layer 20 disposed on the base substrate 10, a light emitting element layer 30 disposed on the pixel circuit layer 20, and an encapsulation layer 40 covering the pixel circuit layer 20 and the light emitting element layer 30.

The base substrate 10 may be a rigid substrate. For example, the base substrate 10 may be made of a transparent insulating material including glass, quartz, polymer resin, etc. For example, the polymer resin may include polyethersulphone (PES), polyacrylate (PA), polyarylate (PAR), polyetherimide (PEI), polyethylene naphthalate (PEN), polyethylene terepthalate (PET), polyphenylene sulfide (PPS), polyallylate, polyimide (PI), polycarbonate (PC), cellulose triacetate (CAT), cellulose acetate propionate (CAP), and combinations thereof. However, exemplary embodiments are not limited thereto, and the base substrate 10 may be a flexible substrate having flexibility.

Transistors constituting each of pixels PX, scan lines SL, data lines DL, power lines PL, a scan control line SCL, a data connection line DLL, a pad connection line PLL, and the like may be disposed in the pixel circuit layer 20. Each of the transistors may include a gate electrode, a semiconductor layer, a source electrode, and a drain electrode.

Light emitting elements included in the respective pixels PX to generate light may be disposed in the light emitting element layer 30. For example, the light emitting elements may be an organic light emitting diode OLED. Alternatively, the light emitting elements may be an inorganic light emitting element including an inorganic light emitting material or a light emitting element (e.g., quantum dot display element) which emits light by changing the wavelength of emitted light by using a quantum dot.

The encapsulation layer 40 may reduce or prevent characteristic degradation of the light emitting element by protecting the light emitting element from an outer environment including moisture and oxygen. The encapsulation layer 40 may be a transparent rigid glass. The encapsulation layer 40 as the rigid glass may be supported by a sealing member (e.g., frit sealing disposed in the non-display region NDA of the base substrate 10) disposed on the base substrate 10. Therefore, the encapsulation layer 40 may be spaced apart from the top of the light emitting element layer 30 at a certain distance G in the vertical direction (i.e., the third direction DR3), and an empty space may be formed between the light emitting element layer 30 and the encapsulation layer 40. However, the encapsulation layer 40 is not limited thereto, and may be formed as a thin film encapsulation layer including at least one inorganic layer and at least one organic layer to have flexibility.

The touch sensor 50 may be directly disposed on an upper surface of the display panel DP. The expression "directly disposed" means that any separate adhesive layer or adhesive member is not provided between the display panel DP and the touch sensor 50. The touch sensor 50 may be formed through a continuous process on the encapsulation layer 40 included in the display panel DP (or in an on-cell manner). More specifically, the touch sensor 50 may be formed by patterning sensing electrodes (see FIG. 4 which will be described later) on the encapsulation layer 40. The touch sensor 50 may sense a touch of a user or recognize a fingerprint of the user.

The polarizing layer 60 may prevent reflection of external light so as to improve visibility at a bright place such as an outdoor environment. For example, the polarizing layer 60 may include a poly ethylene terephthalate (PET) film or tri-acetyl cellulose (TAC) film as a film that is able to perform vertical or horizontal polarization of incident light by selectively transmitting or blocking vertical incident light or horizontal incident light. The polarizing layer 60 may be adhered to a lower surface of the cover window 80 by the adhesive layer 70. Therefore, the cover window 80 may be disposed on the polarizing layer 60.

The adhesive layer 70 may be a transparent adhesive material in which an air gap is filled between the polarizing layer 60 and the cover window 80, to prevent loss of light and improve transmittance of light. For example, the adhesive layer 70 may be an optically clear adhesive (OCA).

The cover window 80 may protect the display panel DP from an external impact, a scratch, etc. while allowing an image displayed on the display panel DP to be transmitted therethrough. The cover window 80 may include a transparent material having rigidity and flexibility. For example, the cover window 80 may include Ultra-Thin Glass (UTG) and Colorless PI (CPI).

Figure 3:
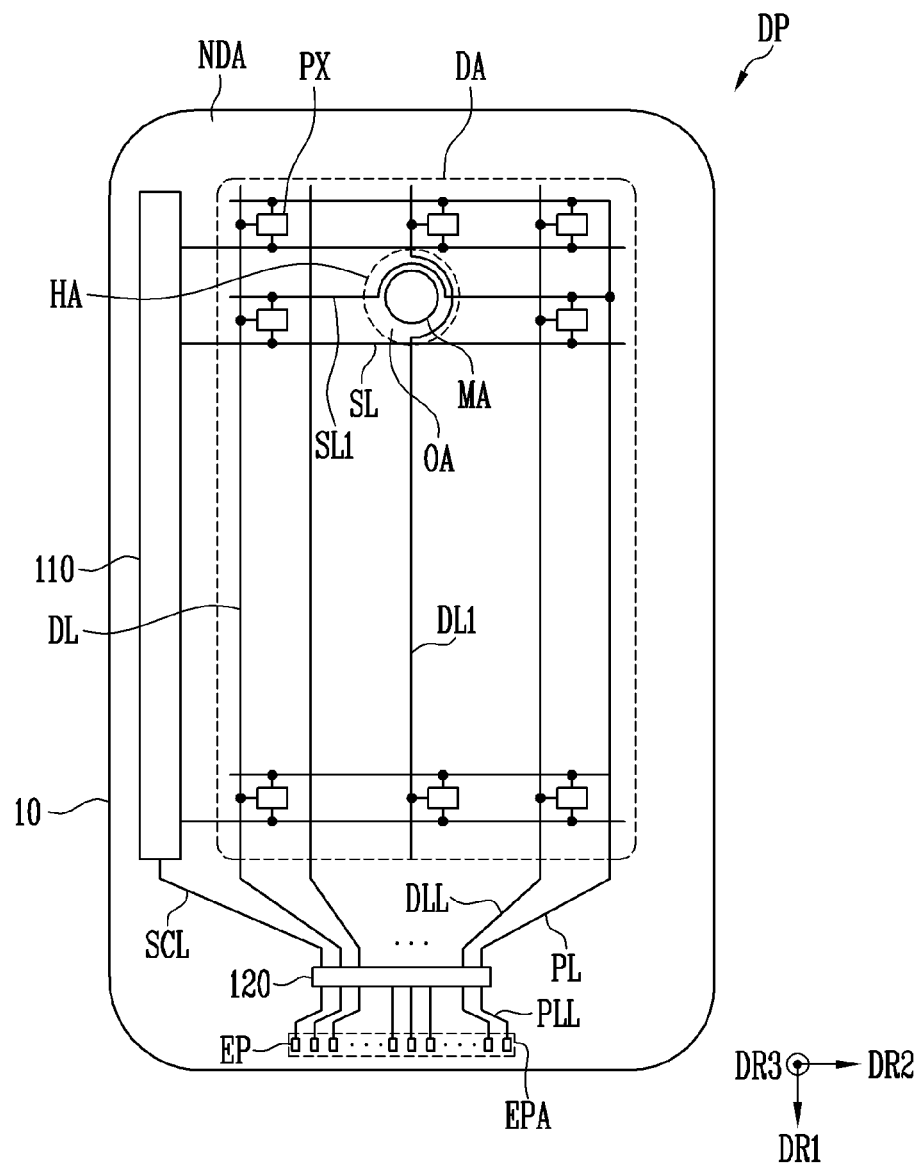
FIG. 3 is a plan view of a display panel of the display device of FIG. 1A.

FIG. 3 is a plan view of a display panel of display device of FIG. 1A.

Referring to FIG. 3, the display panel DP may include the base substrate 10, pixels PX, scan lines SL, data lines DL, power lines PL, a scan control line SCL, a scan driver 110, a display driving circuit 120, display electrode pads EP, a data connection line DLL, and/or a pad connection line PLL.

The display region DA, the non-display region NDA, and the hole region HA included in the display region DA may be defined on the base substrate 10.

Each of the pixels PX may include a driving transistor, at least one switching transistor, a light emitting element, a capacitor, and the like. The driving transistor, the at least one switching transistor, and the capacitor may be disposed in the pixel circuit layer 20 shown in FIG. 2, and the light emitting element may be disposed in the light emitting element layer 30 shown in FIG. 2. The pixel PX may be implemented when the above-described components are electrically connected in various circuit forms. In this description, the pixel PX is not limited to a specific pixel PX. Each of the pixels PX may be connected to at least one of the scan lines SL, at least one of the data lines DL, and at least one of the power lines PL. Each of the pixels PX may overlap the display region DA, and may not overlap the non-display region NDA and the hole region HA. However, some insulating layers (or insulating films) defining the pixel PX may overlap a portion (or, more particularly, the second region OA) of the hole region HA, and may not overlap the first region MA.

In an exemplary embodiment, the scan line SL may extend in the second direction DR2, and the data line DL may extend in the first direction DR1. The power line PL may include at least one line extending in the first direction DR1 and a plurality of lines branching off in the second direction DR2 or the opposite direction of the second direction DR2 from the at least one line.

In addition, a first scan line SL1 passing through the hole region HA among the scan lines SL may pass through the second region OA while surrounding at least a portion of an edge of the first region MA at the outside, and extend in the second direction DR2. For example, the first scan line SL1 may extend along the outline of the first region MA. In addition, a first data line DL1 passing through the hole region HA among the data lines DL may pass through the second region OA while surrounding at least a portion of an edge of the first region MA at the outside, and extend in the first direction DR1. For example, the first data line DL1 may extend along the outline of the first region MA. The first data line DL1 and the first scan line SL1 may be electrically insulated from each other. For example, some portions of the first data line DL1 and the first scan line SL1 may extend side by side in a plan view, and may be curved.

The scan driver 110, the display driving circuit 120, the scan control line SCL, the data connection line DLL, and the pad connection line PLL may overlap the non-display region NDA. Although a case where the scan driver 110 is disposed in the non-display region NDA located at one side of the display region (in the opposite direction of the second direction DR2) has been illustrated in FIG. 3, exemplary embodiments are not limited thereto. For example, the scan driver 110 may be disposed in the non-display region located at both sides of the display region DA (in the second direction DR2 and the opposite direction of the second direction DR2).

The display driving circuit 120 may be connected to the display electrode pad EP overlapping a display pad region EPA. The display pad region EPA may be included in the non-display region NDA. The display driving circuit 120 may supply a data signal to the data line DL through the data connection line DLL. Also, the display driving circuit 120 may generate a scan control signal for controlling the scan driver 110, and supply the scan control signal to the scan driver 110 through the scan control line SCL. The display driving circuit 120 may include a data driver which supplies a data signal to the data line DL and a timing controller which controls the data driver and the scan driver 110.

In an exemplary embodiment, the display driving circuit 120 may be configured with an integrated circuit IC to be attached onto the base substrate 10 in a chip on glass (COG) method, a chip on plastic (COP) method, or an ultrasonic bonding method.

Figure 4:
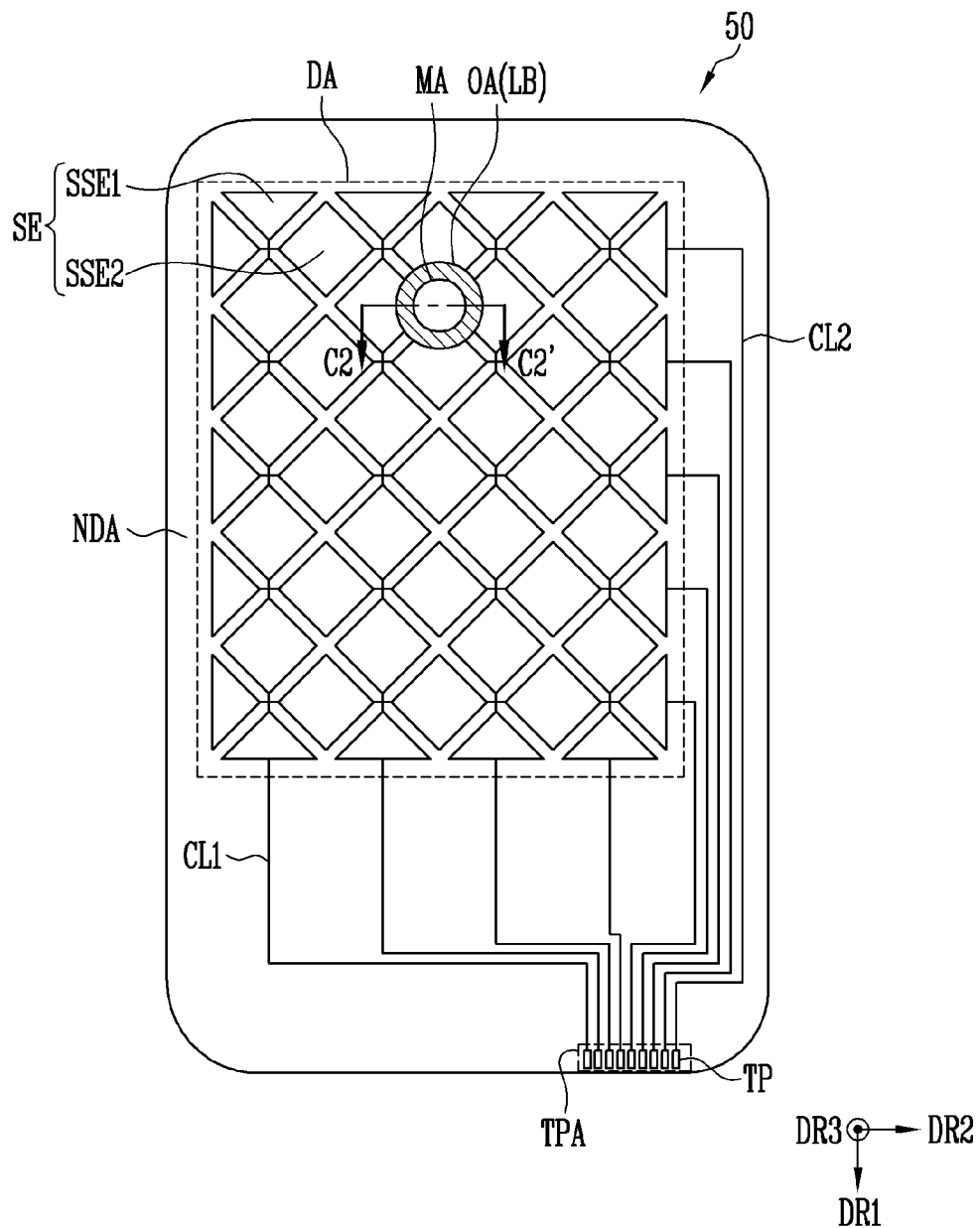
FIG. 4 is a plan view of a touch sensor of the display device of FIG. 1A.

FIG. 4 is a plan view of a touch sensor of the display device of FIG. 1A.

Referring to FIG. 4, the touch sensor 50 may include a plurality of sensing electrodes SE, first signal lines CL1, second signal lines CL2, a light blocking member LB (an outer hole region designated as OA), and/or at least one touch electrode pad TP.

Each of the sensing electrodes SE may have a generally rhombic shape, and be a generally flat type electrode made of a transparent electrode. However, exemplary embodiments are not necessarily limited thereto. Each of the sensing electrodes SE may have various polygonal shapes, and be a mesh type electrode which has flexibility and is not viewed from the outside. For example, the sensing electrodes SE may be made of silver, aluminum, copper, chromium, nickel, titanium, or the like, to which a low temperature process is applicable.

The sensing electrodes SE may include first sensing electrodes SSE1 and second sensing electrodes SSE2. The first sensing electrodes SSE1 may be arranged in the first direction DR1, adjacent first sensing electrodes among the first sensing electrodes SSE1 may be connected to each other through a first connection pattern. The first connection pattern may be integrally formed with the first sensing electrode SSE1 by using the same material as the first sensing electrode SSE1. Alternatively, the first connection pattern may be formed separately from the first sensing electrode SSE1 by using a separate material. The second sensing electrodes SSE2 may be arranged in the second direction DR2, and adjacent second sensing electrodes among the second sensing electrodes SSE2 may be connected to each other through a second connection pattern. The second connection pattern may be integrally formed with the second sensing electrode SSE2 by using the same material as the second sensing electrode SSE2. Alternatively, the second connection pattern may be formed separately from the second sensing electrode SSE2 by using a separate material. The first connection pattern and the second connection pattern may be electrically insulated from each other, and be formed in layers (layers along the third direction DR3) independent from each other.

First sensing electrodes arranged in the same column among the first sensing electrodes SSE1 may be connected to the touch electrode pad TP through one first signal line CL1. Second sensing electrodes arranged in the same row among the second sensing electrodes SSE2 may be connected to the touch electrode pad TP through one second signal line CL2. For example, one of the first signal line CL1 and the second signal line CL2 may transfer a driving signal for touch sensing to the touch electrode pad TP, and the other of the first signal line CL1 and the second signal line CL2 may transfer a touch sensing signal to the touch electrode pad TP. The touch electrode pad TP may be connected to an external driving circuit to relay transmission/reception of the driving signal and the touch sensing signal to the sensing electrodes SE.

The sensing electrodes SE may overlap the display region DA and not to overlap the hole region HA. For example, the sensing electrodes SE may not overlap the first region MA and the second region OA of the hole region HA. The first signal line CL1 and the second signal line CL2 may overlap the non-display region NDA. In addition, the touch electrode pad TP may overlap a touch pad region TPA included in the non-display region NDA.

The light blocking member LB may overlap the second region OA, and be made of a metallic material. For example, the light blocking member LB is an opaque metal conductive layer, and may be a single layer or a multi-layer, which is made of any one of molybdenum (Mo), niobium (Nb), aluminum (Al), chromium (Cr), gold (Au), titanium (Ti), nickel (Ni), neodymium (Nd), and copper (Cu), or any combination thereof.

Figure 5:
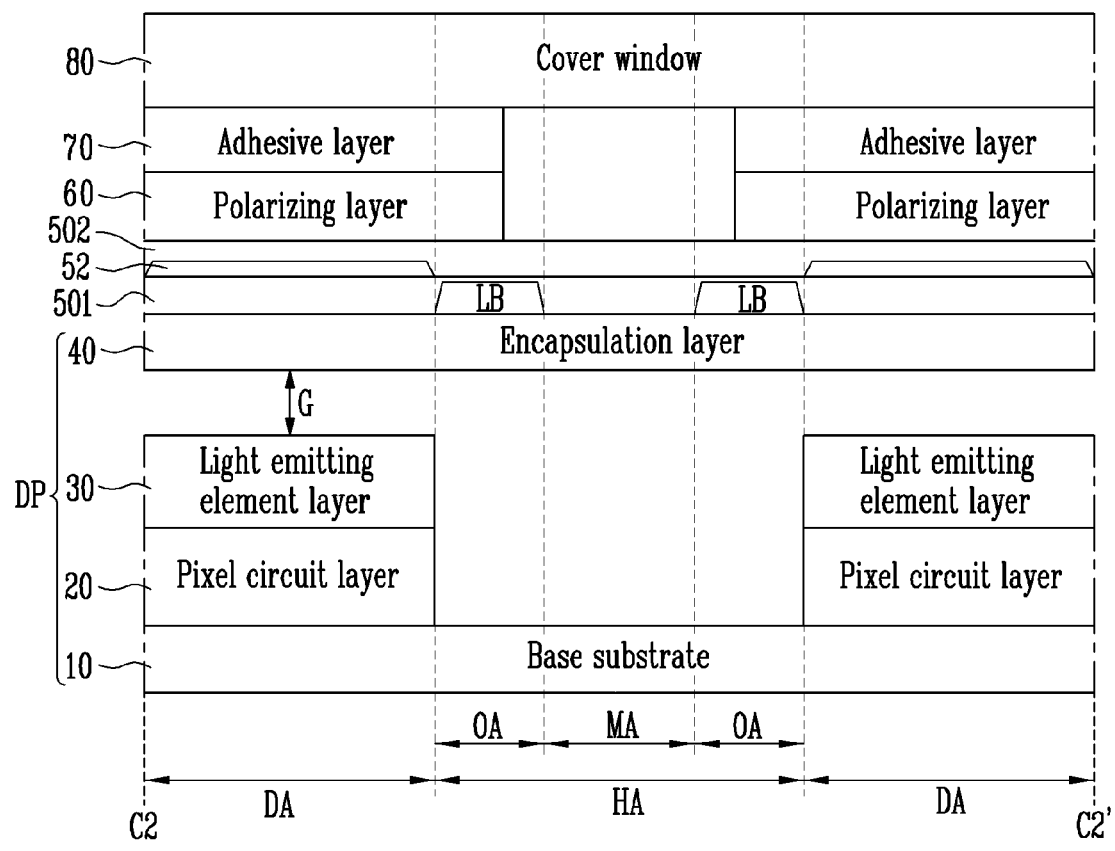
FIG. 5 is a sectional view taken along line C2-C2' of FIG. 1B.
Figure 6:
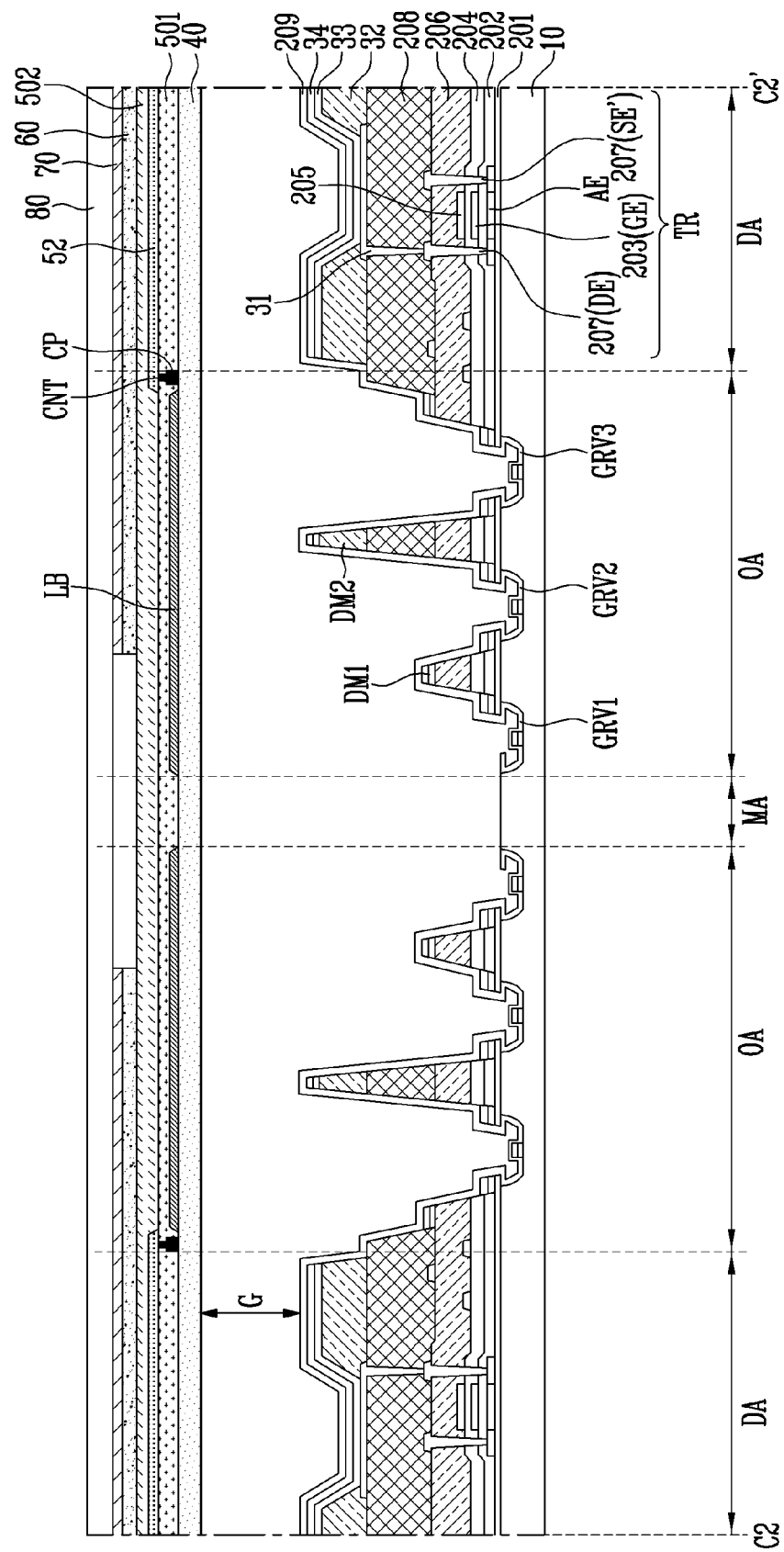
FIG. 6 is a sectional view taken along line C2-C2' of FIG. 1B illustrating the sectional view of FIG. 5 in more detail.

FIG. 5 is a sectional view taken along line C2-C2' of FIG. 1B. FIG. 6 is a sectional view taken along line C2-C2' of FIG. 1B illustrating the sectional view of FIG. 5 in more detail.

Each of layers described herein may be provided in a single layer or a multi-layer, at least another layer may be further disposed between the layers, and some layers may be omitted. In addition, the section corresponding to the line C2-C2' shown in FIG. 1B may be identical to or correspond to that corresponding to the line C2-C2' shown in FIG. 4.

Referring to FIGS. 5 and 6, the overlapping relationship between the components of the display device 100 and the hole region HA is illustrated.

At least one of the camera module or the sensor module or the like may be disposed on the bottom of the base substrate 10 (or in the opposite direction of the third direction DR3) and be received within the hole region HA. Specifically, for example, a lens of the camera module may be received in the first region MA of the hole region HA. The first region MA may have an area equal to or greater than that of the lens of the camera module.

The base substrate 10 may entirely overlap the hole region HA. For example, when the base substrate 10 is a transparent substrate such as glass or quartz, light may be projected while passing through the base substrate 10, and therefore, the base substrate 10 may entirely overlap the hole region HA.

The pixel circuit layer 20 and the light emitting element layer 30 may not overlap the hole region HA. In another example, the pixel circuit layer 20 and the light emitting element layer 30 may overlap the display region DA, and may not overlap the first region MA. However, at least one of the pixel circuit layer 20 and the light emitting element layer 30 may overlap at least a portion of the second region OA. For example, the pixel circuit layer 20 may overlap at least a portion of the second region OA, and the light emitting element layer 30 may not overlap the second region OA.

The display device may include the display panel DP, the touch sensor 50, the polarizing layer 60, the adhesive layer 70, and/or the cover window 80.

The display panel DP may include the base substrate 10 on which the display region DA and the hole region HA included in the display region DA are defined, the pixel circuit layer 20 disposed on the base substrate 10, the light emitting element layer 30 disposed on the pixel circuit layer 20, and the encapsulation layer 40 covering the pixel circuit layer 20 and the light emitting element layer 30.

Referring to FIG. 6, the pixel circuit layer 20 may include a buffer layer 201, a semiconductor layer AE, a first insulating layer 202, a first conductive layer 203, a second insulating layer 204, a second conductive layer 205, a third insulating layer 206, a third conductive layer 207, and a fourth insulating layer 208.

A plurality of thin film transistors including a driving transistor TR and switching transistors are disposed on the buffer layer 201. The pixel PX may include at least one driving transistor TR.

The driving transistor TR may include the semiconductor layer AE, a gate electrode GE, a source electrode SE, and a drain electrode DE. The semiconductor layer AE may be disposed on the buffer layer 201. The semiconductor layer AE may include at least one of amorphous silicon, poly-silicon, a low temperature poly-silicon (LTPS), and an organic semiconductor. In another exemplary embodiment, the semiconductor layer AE may be an oxide semiconductor. The semiconductor layer AE may include a channel region, and a source region and a drain region, which are disposed both sides of the channel region and are doped with an impurity.

The first insulating layer 202 may be disposed over the semiconductor layer AE. The first insulating layer 202 may be a gate insulating layer. The first insulating layer 202 may include a silicon compound, a metal oxide, etc. For example, the first insulating layer 202 may include silicon oxide (SiOx), silicon nitride (SiNx), silicon oxynitride, aluminum oxide, tantalum oxide, hafnium oxide, zirconium oxide, titanium oxide, etc., which may be used solely or as a combination thereof. The first insulating layer 202 may be a single layer or a multi-layer configured with stacked layers of different materials.

The first conductive layer 203 may be disposed on the first insulating layer 202. At least a portion of the first conductive layer 203 may overlap the semiconductor layer AE. The first conductive layer 203 may include the gate electrode GE. The first conductive layer 203 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tungsten (W), and copper (Cu). The first conductive layer 203 may be a single layer or a multi-layer.

The second insulating layer 204 covering the first conductive layer 203 may be disposed over the first conductive layer 203. The second insulating layer 204 may be a gate insulating layer having a gate insulating function. The second insulating layer 204 may include the same material as the first insulating layer 202, or include at least one material selected from the materials exemplified as the material constituting the first insulating layer 202. The second insulating layer 204 may be a single layer or a multi-layer configured with stacked layers of different materials.

At least one of the first insulating layer 202 and the second insulating layer 204 may overlap at least a portion of the second region OA.

The second conductive layer 205 may be disposed on the second insulating layer 204. At least a portion of the second conductive layer 205 may overlap at least one of the semiconductor layer AE and the gate electrode GE. The second conductive layer 205 may include the same material as the first conductive layer 203, or include at least one material selected from the materials exemplified as the material constituting the first conductive layer 203. The second conductive layer 205 may be a single layer or a multi-layer configured with stacked layers of different materials.

The second conductive layer 205 may include at least one of one electrode of a storage capacitor of the pixel PX, the first signal line CL1, and a second signal line CL2.

The third insulating layer 206 covering the second conductive layer 205 may be disposed over the second conductive layer 205. The third insulating layer 206 may be an interlayer insulating layer. The third insulating layer 206 may include an inorganic insulating material such as silicon oxide, silicon nitride, silicon oxynitride, hafnium oxide, aluminum oxide, titanium oxide, tantalum oxide, or zinc oxide, or an organic insulating material such as polyacrylates resin, epoxy resin, phenolic resin, polyamides resin, polyimides resin, unsaturated polyesters resin, polyphenylenethers resin, polyphenylenesulfides resin, or benzocyclobutene (BCB). The third insulating layer 206 may be a single layer or a multi-layer configured with stacked layers of different materials.

The third conductive layer 207 may be disposed on the third insulating layer 206. The third conductive layer 207 may include the source electrode SE and the drain electrode DE, which are electrically connected to the semiconductor layer AE.

The fourth insulating layer 208 covering the third conductive layer 207 may be disposed over the third conductive layer 207. The fourth insulating layer 208 may be a protective layer, a passivation layer, and/or a via layer. The fourth insulating layer 208 may be formed of an inorganic material, an organic material, or an organic/inorganic composite material in a single- or multi-layered structure, and be formed by various deposition methods. In some exemplary embodiments, the fourth insulating layer 208 may be formed of at least one material among polyacrylates resin, epoxy resin, phenolic resin, polyamides resin, polyimides resin, unsaturated polyesters resin, polyphenylenethers resin, polyphenylenesulfides resin, and benzocyclobutene (BCB).

The light emitting element layer 30 may be disposed on the fourth insulating layer 208. The light emitting element layer 30 may include a first pixel electrode 31, a pixel defining layer 32, a light emitting layer 33, and a second pixel electrode 34.

The first pixel electrode 31 may be disposed on the fourth insulating layer 208. The first pixel electrode 31 may be an anode electrode of the organic light emitting diode OLED.

The first pixel electrode 31 may include a material having a high work function. The first pixel electrode 31 may include Indium Tin Oxide (ITO), Indium Zinc Oxide (IZO), Zinc Oxide (ZnO), Indium Oxide ($In_2O_3$), etc. The exemplified conductive materials have a transparent property while having a relatively high work function. When the display device 100 is of a top-emission type, the first pixel electrode 31 may further include a reflective material, e.g., silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or mixtures thereof, in addition to the exemplified conductive material. Therefore, the first pixel electrode 31 may have a single-layered structure configured with the exemplified conductive material and the exemplified reflective material, or have a multi-layered structure in which the exemplified conductive material and the exemplified reflective material are stacked.

The pixel defining layer 32 may be disposed over the first pixel electrode 31. The pixel defining layer 32 includes an opening exposing at least a portion of the first pixel electrode 31. The pixel defining layer 32 may include an organic material or an inorganic material. In an exemplary embodiment, the pixel defining layer 32 may include materials such as photoresist, polyimide-based resin, acrylic-based resin, silicon compound, and polyacrylic-based resin.

The light emitting layer 33 may be disposed on the first pixel electrode 31 exposed by the pixel defining layer 32. The second pixel electrode 34 is disposed on the light emitting layer 33. The second pixel electrode 34 may be a common electrode of a plurality of pixels PX. Also, the second pixel electrode 34 may be a cathode electrode of the organic light emitting diode OLED.

The second pixel electrode 34 may include a material having a low work function. The second pixel electrode 34 may include Li, Ca, LiF/Ca, LiF/Al, Al, Mg, Ag, Pt, Pd, Ni, Au Nd, Ir, Cr, BaF, Ba, or a compound or mixture thereof (e.g., a mixture of Ag and Mg). The second pixel electrode 34 may be connected to the power line PL through an electrode formed in the same layer as the first pixel electrode 31. The first pixel electrode 31, the light emitting layer 33, and the second pixel electrode 34, which are described above, may constitute the organic light emitting diode OLED.

A capping layer 209 may be disposed over the light emitting element layer 30. The capping layer 209 may provide light emitted from the light emitting element layer 30 to the outside of the display panel DP. For example, the capping layer 209 may be formed of an inorganic material such as alkali fluoride (e.g., LiF), silicon nitride, silicon oxide, or silicon oxynitride, an organic material such as a-NPD, NPB, TPD, m-MTDATA, $Alq_3$ or CuPc, or an organic/inorganic composite material. The capping layer 209 may be formed through chemical vapor deposition (CVD) or atomic layer deposition (ALD). Also, the capping layer 209 may be omitted in some cases.

The encapsulation layer 40 may substantially entirely overlap the hole region HA. For example, when the encapsulation layer 40 is a transparent rigid glass, light may be transferred to the camera module or the sensor module while passing through the encapsulation layer 40.

The touch sensor 50 may include the light blocking member LB disposed on the encapsulation layer 40 and a first sensing electrode layer of the first sensing electrode SSE1 (which may be illustrated when the display device 100 is taken along a section perpendicular to the line C2-C2' and disposed on the encapsulation layer 40), a first sensing insulating layer 501 covering the first sensing electrode layer and the light blocking member LB, a second sensing electrode layer 52 of the second sensing electrodes SSE2 disposed on the first sensing insulating layer 501, and a second sensing insulating layer 502 covering the second sensing electrode layer 52. The first sensing electrodes SSE1 may include the first sensing electrode layer, and the second sensing electrodes SSE2 may include the second sensing electrode layer 52. In some exemplary embodiments, the encapsulation layer 40 may be construed as a base layer of the touch sensor 50.

At least one of the first sensing electrode layer and the second sensing electrode layer 52 may include a transparent conductive material which enables light to be transmitted therethrough. For example, the first sensing electrode layer and the second sensing electrode layer 52 may include a transparent conductive material such as indium tin oxide (ITO) or indium zinc oxide (IZO). The first sensing electrode layer and the second sensing electrode layer 52 do not overlap the hole region HA, but may overlap the display region DA. In another example, the first sensing electrode layer and the second sensing electrode layer 52 may overlap a portion of the second region OA. In addition, second sensing electrode layers 52 disposed at the periphery of the hole region HA may be electrically connected to each other through a second connection line CP. The second connection line CP may be electrically connected to the second sensing electrode layer 52 through a contact hole CNT. Similarly, first sensing electrodes SSE1 disposed at the periphery of the hole region HA may be electrically connected to each other through a first connection line disposed on the encapsulation layer 40. The first connection line may be electrically connected to the first sensing electrode layer through a contact hole.

The light blocking member LB may entirely overlap the second region OA of the hole region HA or overlap a portion of the second region OA. The light blocking member LB may be disposed not to overlap the first region MA.

The first sensing insulating layer 501 may electrically insulate the first sensing electrode layer and the second sensing electrode layer 52 from each other. For example, the first sensing insulating layer 501 may be an inorganic layer, and include at least one of silicon nitride, silicon oxynitride, silicon oxide, titanium oxide, and aluminum oxide.

The second sensing insulating layer 502 may electrically insulate the second sensing electrode layer 52. For example, the second sensing insulating layer 502 may be an inorganic layer, and include at least one of silicon nitride, silicon oxynitride, silicon oxide, titanium oxide, and aluminum oxide.

In FIGS. 5 and 6, the first sensing insulating layer 501 and the second sensing insulating layer 502 may entirely overlap the hole region HA.

The polarizing layer 60 may overlap the display region DA and at least a portion of the second region OA, and may not overlap the first region MA. Since light is transmitted through the cover window 80 when the cover window 80 is transparent glass, the cover window 80 may entirely overlap the hole region HA.

Referring to FIG. 6, an upper surface (surface facing the third direction DR3) of the base substrate 10 may include at least one of first, second, and third grooves GRV1, GRV2, and GRV3 in a region overlapping the hole region HA (more particularly, a region overlapping the second region OA of the hole region HA). For example, the upper surface of the base substrate 10 may include the first groove GRV1, the second groove GRV2, and the third groove GRV3.

The first groove GRV1 may be more adjacent to the first region MA than the display region DA at the periphery of the hole region HA, the third groove GRV3 may be more adjacent to the display region DA at the periphery of the hole region HA than the first region MA, and the second groove GRV2 may be located between the first groove GRV1 and the third groove GRV3.

The first, second, and third grooves GRV1, GRV2, and GRV3 may block penetration of oxygen or moisture which may be introduced to the display region DA from the hole region HA. The first, second, and third grooves GRV1, GRV2, and GRV3 may be formed when at least a portion of the base substrate 10 is removed. For example, the first, second, and third grooves GRV1, GRV2, and GRV3 may be formed when at least a portion in a direction toward a rear surface from a front surface of the base substrate 10 is removed. When viewed on a plane, the first, second, and third grooves GRV1, GRV2, and GRV3 may be disposed in the shape of a closed curve or ring, which surrounds the first region MA.

Dams DM1 and DM2 may be disposed on a region overlapping the hole region HA of the base substrate 10. For example, the dams DM1 and DM2 may include a first dam DM1 and a second dam DM2. The second dam DM2 may be formed closer to the first region MA than the first dam DM1. In some exemplary embodiments, the dams DM1 and DM2 may be included in the display panel DP.

The first dam DM1 may include the same material as the third insulating layer 206. The first dam DM1 may be simultaneously formed with the third insulating layer 206. The first dam DM1 and the third insulation layer 206 may be disposed on the same layer. The first dam DM1 may be located between the first groove GRV1 and the second groove GRV2.

The second dam DM2 may include the same material as the pixel defining layer 32. The second dam DM2 may be simultaneously formed with the pixel defining layer 32. The second dam DM2 and the pixel defining layer 32 may be disposed on the same layer. The second dam DM2 may be located between the second groove GRV2 and the third groove GRV3.

The dams DM1 and DM2 may block penetration of oxygen or moisture which may be introduced to the display region DA from the hole region HA, and prevent the periphery of the hole region HA from being damaged.

Figure 7:
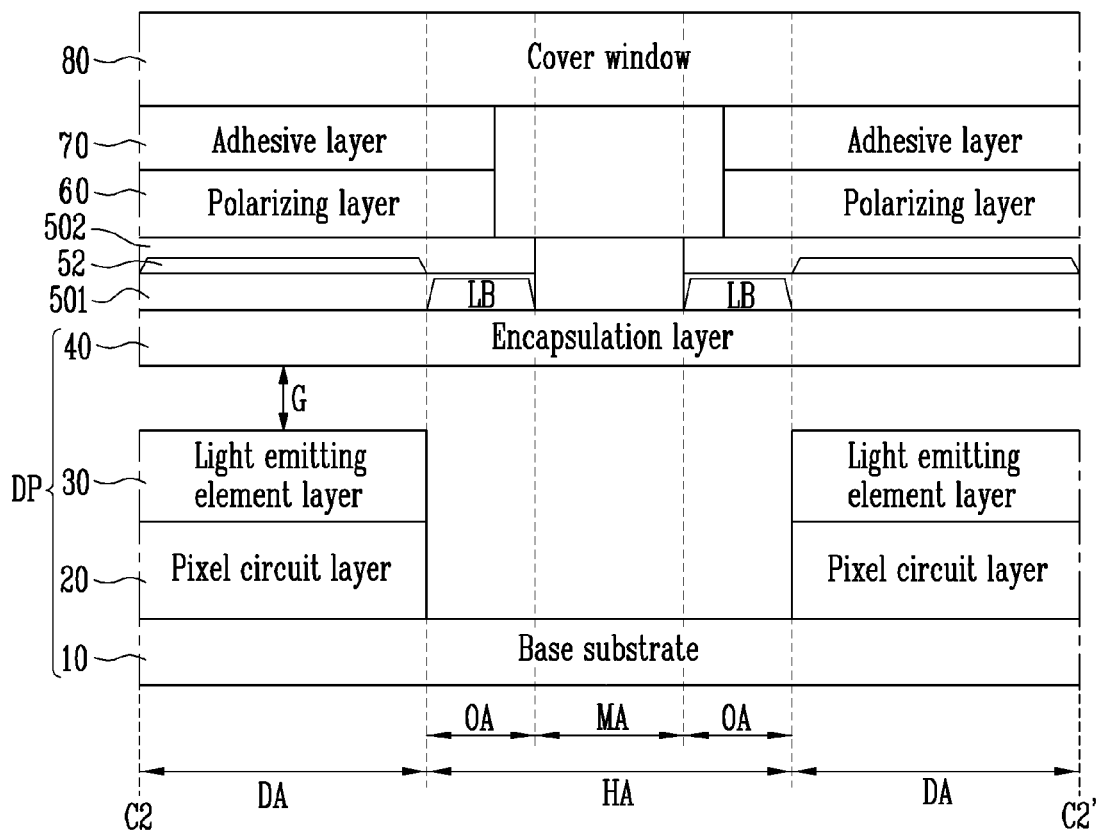
FIG. 7 is a sectional view taken along line C2-C2' of FIG. 1B illustrating another exemplary embodiment of the display device of FIG. 1A.
Figure 8:
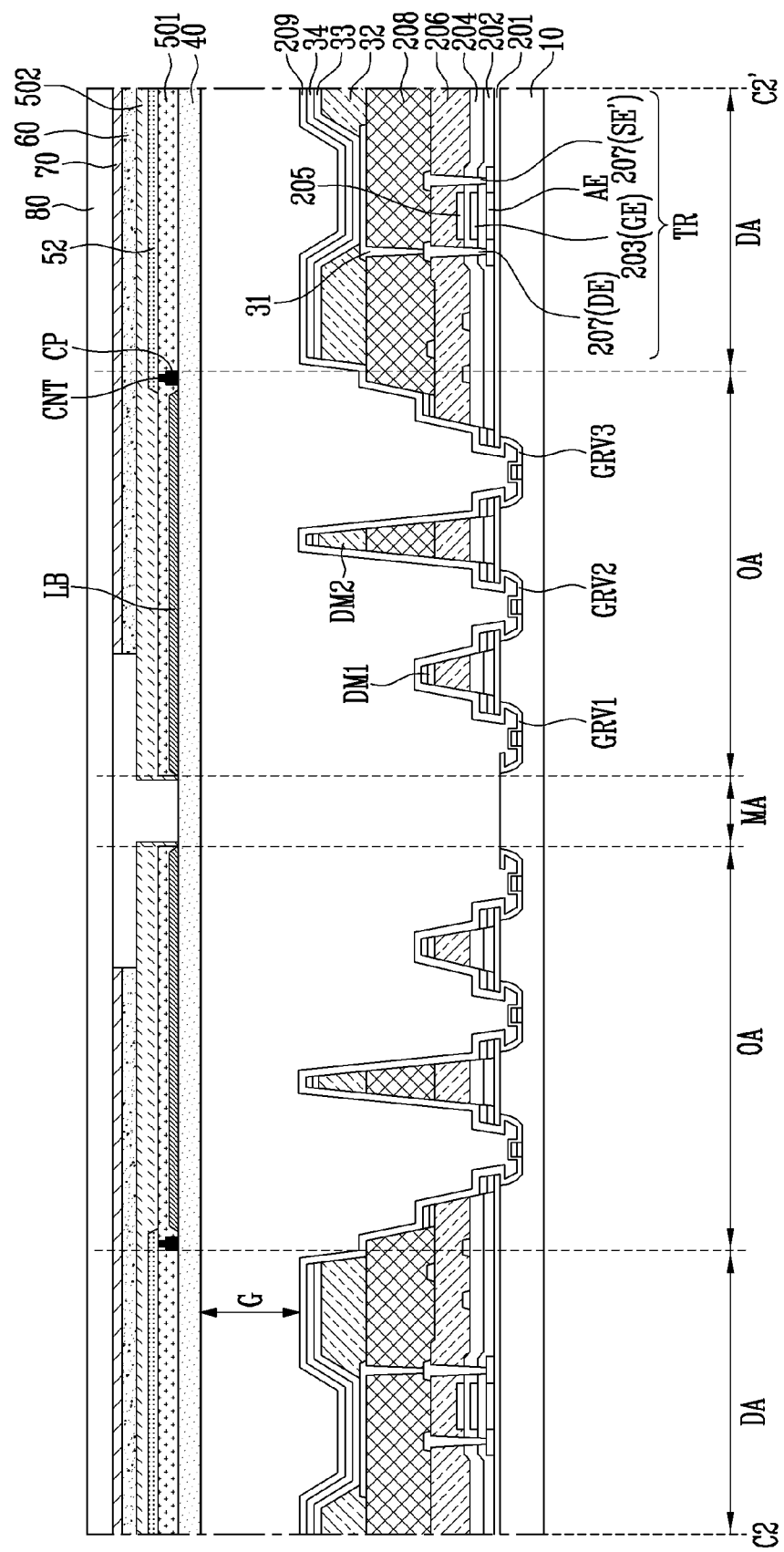
FIG. 8 is a sectional view taken along line C2-C2' of FIG. 1B illustrating the sectional view of FIG. 7 in more detail.

FIG. 7 is a sectional view taken along line C2-C2' of FIG. 1B illustrating another exemplary embodiment of the display device of FIG. 1A. FIG. 8 is a sectional view taken along line C2-C2' of FIG. 1B illustrating the sectional view of FIG. 7 in more detail.

In the case of the display device shown in FIGS. 5 and 6, the first sensing insulating layer 501 and the second sensing insulating layer 502, which are included in the touch sensor 50, overlap the hole region HA (more particularly, the first region MA). Therefore, when light is incident through the first region MA, the light is to pass through the cover window 80, the first sensing insulating layer 501, the second sensing insulating layer 502, the encapsulation layer 40, and the base substrate 10. However, transmittance ratios of light passing through the cover window 80, the first sensing insulating layer 501, the second sensing insulating layer 502, the encapsulation layer 40, and the base substrate 10 are different from each other depending on light source wavelengths, and hence some color distortion of a subject to be photographed may occur.

In order to solve this problem, in a display device shown in FIGS. 7 and 8, at least one of the first sensing insulating layer 501 and the second sensing insulating layer 502 may not overlap the hole region HA.

More specifically, at least one of the first sensing insulating layer 501 and the second sensing insulating layer 502 may overlap the second region OA, and may not overlap the whole of the first region MA or a portion of the first region MA.

Thus, in the case of the display device shown in FIGS. 7 and 8, light can reach the camera module while passing through only the cover window 80, the encapsulation layer 40, and the base substrate 10, without passing through the first sensing insulating layer 501 and the second sensing insulating layer 502, and accordingly, the above-described problem can be solved.

Figure 9:
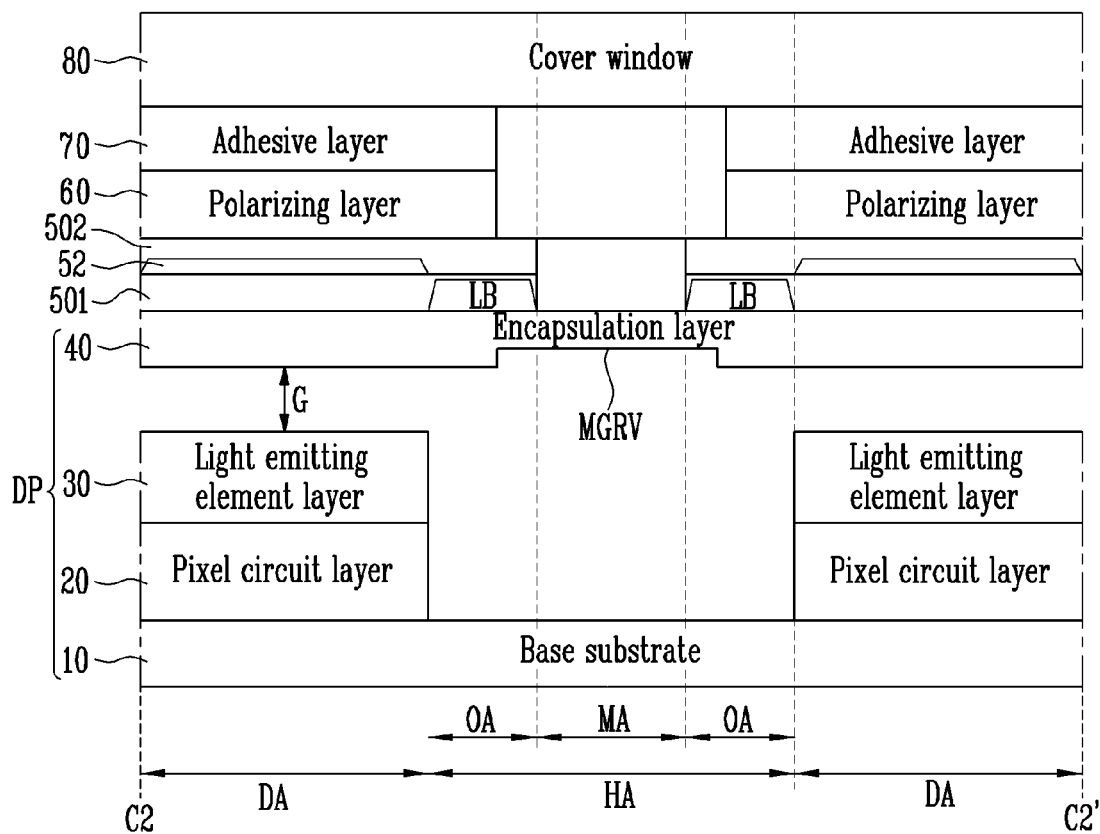
FIG. 9 is a sectional view taken along line C2-C2' of FIG. 1B illustrating another exemplary embodiment of the display device of FIG. 1A.
Figure 10:
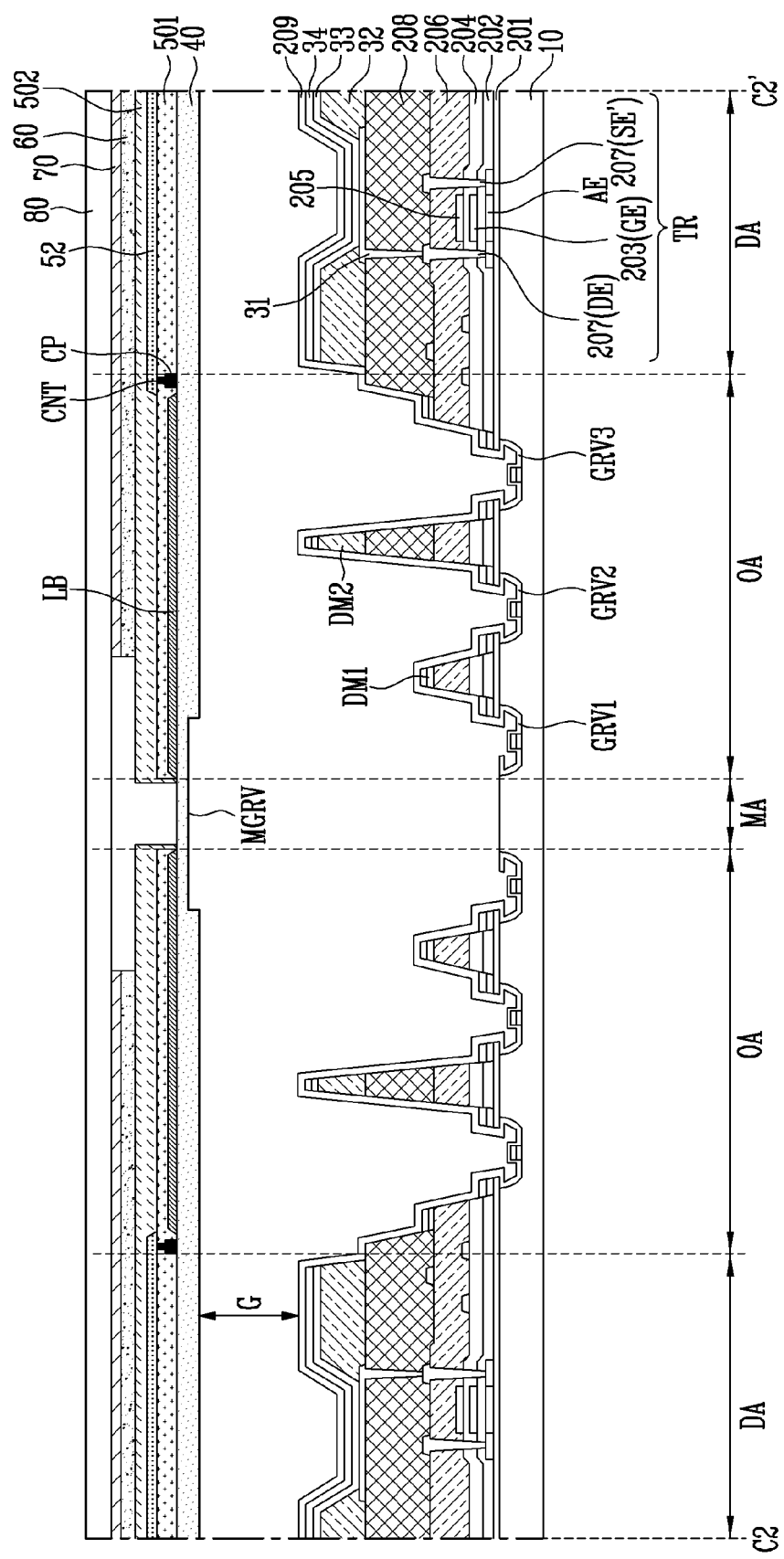
FIG. 10 is a sectional view taken along line C2-C2' of FIG. 1B illustrating the sectional view of FIG. 9 in more detail.

FIG. 9 is a sectional view taken along line C2-C2' of FIG. 1B illustrating another exemplary embodiment of the display device of FIG. 1A. FIG. 10 is a sectional view taken along line C2-C2' of FIG. 1B illustrating the sectional view of FIG. 9 in more detail.

In the display device shown in FIGS. 5 and 6, a space is formed between the encapsulation layer 40 and the light emitting element layer 30 since the encapsulation layer 40 and the light emitting element layer 30 are disposed to be spaced apart from each other at a certain distance G. However, when the space formed described above is too shallow, light projected through the first region MA still may be scattered or be reflected in the first region MA.

In order to solve this problem, in a display device shown in FIGS. 9 and 10, a lower surface (surface facing the opposite direction of the third direction DR3) of the encapsulation layer 40, which overlaps the first region MA, may be etched toward the third direction DR3. Therefore, the lower surface of the encapsulation layer 40 may include a groove MGRV overlapping at least a portion of the hole region HA. The groove MGRV may be formed to substantially entirely overlap the first region MA and to overlap at least a portion of the second region OA. For example, the groove MGRV may include a stepped portion that is disposed in the second region OA.

In addition, at least a portion of the groove MGRV may overlap at least one of the first sensing insulating layer 501 and the second sensing insulating layer 502.

Thus, in the display device shown in FIGS. 9 and 10, a cavity having a greater depth than that formed be the space G can be sufficiently formed between the lower surface of the encapsulation layer 40 and the base substrate 10, and accordingly, light projected through the first region MA can be transferred to the camera module or the sensor module without undue interference or distortion.

In display devices constructed in accordance with the principles and exemplary embodiments of the invention, the transmittance of light transferred through the hole region located in the display region is improved, so that color distortion of a subject obtained through the camera module overlapping the hole region can be reduced or prevented.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a display panel including a base substrate having a display region and a hole region included in the display region; and
    a touch sensor including a light blocking member disposed on the display panel, a first sensing insulating layer disposed on the light blocking member, a sensing electrode layer disposed on the first sensing insulating layer, and a second sensing insulating layer disposed on the sensing electrode layer;
    wherein at least one of the first sensing insulating layer and the second sensing insulating layer exposes at least a portion of the hole region,
    wherein the hole region includes a first region through which light is transmitted and a second region which surrounds a periphery of the first region and blocks light, and
    wherein the first sensing insulating layer is horizontally adjacent to the light blocking member.

2. The display device of claim 1, wherein the light blocking member is not disposed above or below the first sensing insulating layer.

3. The display device of claim 1, wherein the display panel further includes:
    a pixel circuit layer disposed on the base substrate;
    a light emitting element layer disposed on the pixel circuit layer; and
    an encapsulation layer disposed on the light emitting element layer.

4. The display device of claim 3, wherein at least a portion of the encapsulation layer is in the hole region.

5. The display device of claim 3, wherein the encapsulation layer has a surface comprising a groove in the hole region.

6. The display device of claim 5, wherein at least a portion of the groove is in the first region.

7. The display device of claim 5, wherein at least one of the first sensing insulating layer and the second sensing insulating layer overlaps at least a portion of the groove.

8. The display device of claim 3, wherein the light blocking member is disposed on the encapsulation layer to be in the second region without being in the first region.

9. The display device of claim 3, wherein the encapsulation layer comprises transparent glass or a thin film encapsulation layer.

10. The display device of claim 3, wherein the sensing electrode layer is in the display region without being in the hole region.

11. The display device of claim 3, wherein the pixel circuit layer and the light emitting element layer are in the display region without being in the first region.

12. The display device of claim 3, wherein the pixel circuit layer includes a buffer layer, a semiconductor layer disposed on the buffer layer, a first insulating layer disposed on the semiconductor layer, a first conductive layer disposed on the first insulating layer, and a second insulating layer disposed on the first conductive layer, and
    wherein at least one of the first insulating layer and the second insulating layer is in the second region.

13. The display device of claim 3, wherein the light emitting element layer includes a first pixel electrode, a pixel defining layer disposed on the first pixel electrode, a light emitting layer disposed on the first pixel electrode exposed by the pixel defining layer, and a second pixel electrode disposed on the light emitting layer, and
    wherein the pixel defining layer and the light emitting layer are in the display region without being in the hole region.

14. The display device of claim 1, wherein the light blocking member and the sensing electrode layer are not horizontally adjacent.

15. The display device of claim 1, wherein the light blocking member does not overlap with the sensing electrode layer.

16. The display device of claim 1, wherein the display device further comprises a polarizing layer disposed on the touch sensor, and
    wherein the polarizing layer is in the second region without being in the first region.

17. The display device of claim 1, wherein at least one of the first sensing insulating layer and the second sensing insulating layer includes at least one of silicon nitride, silicon oxynitride, silicon oxide, titanium oxide, and aluminum oxide.

18. The display device of claim 1, wherein the sensing electrode layer is not in the hole region.

19. A display device comprising:
    a display panel including a base substrate having a display region and a hole region included in the display region; and
    a touch sensor including an opaque metal conductive layer disposed on the display panel, a first sensing insulating layer disposed on the opaque metal conductive layer, a sensing electrode layer disposed on the first sensing insulating layer, and a second sensing insulating layer disposed on the sensing electrode layer;

wherein at least one of the first sensing insulating layer and the second sensing insulating layer exposes at least a portion of the hole region, and wherein the hole region includes a first region through which light is transmitted and a second region which surrounds a periphery of the first region, wherein the first sensing insulating layer is horizontally adjacent to the opaque metal conductive layer.

20. The display device of claim 19, wherein the opaque metal conductive layer is not disposed above or below the first sensing insulating layer.

21. The display device of claim 19, wherein the display panel further includes:

a pixel circuit layer disposed on the base substrate;

a light emitting element layer disposed on the pixel circuit layer; and an encapsulation layer disposed on the light emitting element layer, wherein at least a portion of the encapsulation layer is in the hole region.

22. The display device of claim 21, wherein the encapsulation layer has a surface comprising a groove in the hole region, and wherein at least a portion of the groove is in the first region.

23. The display device of claim 21, wherein the opaque metal conductive layer is disposed on the encapsulation layer to be in the second region without being in the first region.

* * * * *